ized patent No.: US 8,261,139 B2

(12) United States Patent
Fujisaki (10) Patent No.: US 8,261,139 B2
(45) Date of Patent: Sep. 4, 2012

(54) CLEAR INSTRUCTION INFORMATION TO INDICATE WHETHER MEMORY TEST FAILURE INFORMATION IS VALID

(75) Inventor: Kenichi Fujisaki, Saitama (JP)

(73) Assignee: Advantest Corporation, Tokyo (JP)

( * ) Notice: Subject to any disclaimer, the term of this patent is extended or adjusted under 35 U.S.C. 154(b) by 419 days.

(21) Appl. No.: 12/709,389

(22) Filed: Feb. 19, 2010

(65) Prior Publication Data

US 2010/0235694 A1 Sep. 16, 2010

Related U.S. Application Data

(63) Continuation of application No. PCT/JP2007/069709, filed on Oct. 9, 2007.

(51) Int. Cl.
*G11C 29/00* (2006.01)

(52) U.S. Cl. ........................................ 714/719

(58) Field of Classification Search ................. None
See application file for complete search history.

(56) References Cited

U.S. PATENT DOCUMENTS

| | | | |
|---|---|---|---|
| 6,173,238 B1 | 1/2001 | Fujisaki | |
| 6,516,430 B1 * | 2/2003 | Ogura et al. | 714/719 |
| 6,684,355 B2 * | 1/2004 | Kawamata | 714/719 |
| 2003/0221145 A1 * | 11/2003 | Stong et al. | 714/718 |
| 2005/0105348 A1 * | 5/2005 | Tanaka et al. | 365/200 |
| 2009/0158087 A1 * | 6/2009 | Maeno et al. | 714/6 |
| 2010/0017651 A1 * | 1/2010 | Garg et al. | 714/6 |

FOREIGN PATENT DOCUMENTS

| | | |
|---|---|---|
| JP | 10-055694 A | 2/1998 |
| JP | 3098700 B2 | 10/2000 |
| JP | 2005-259265 A | 9/2005 |
| JP | 2006-139892 A | 6/2006 |

OTHER PUBLICATIONS

International Search Report (ISR) issued in PCT/JP2007/069709 (parent application) for Examiner consideration.
Written Opinion (PCT/ISA/237) issued in PCT/JP2007/069709 (parent application).

* cited by examiner

*Primary Examiner* — Gabriel Chu
(74) *Attorney, Agent, or Firm* — Chen Yoshimura LLP (57) ABSTRACT

A test apparatus includes a fail memory (AFM) for storing therein fail information in association with each of the addresses of a memory under test and a mark memory (CMM) for storing therein, in association with each of the addresses of the memory under test, validity information indicating whether the fail information stored in the AFM is valid. When the validity information read from the CMM in association with an address under test indicates that the fail information that has been stored in the AFM is invalid, the test apparatus overwrites the fail information stored in the AFM with the fail information that is newly generated by a current test. On the other hand, when the validity information read from the CMM indicates that the fail information is valid, the test apparatus updates the fail information stored in the AFM with the new fail information and writes the updated fail information back into the AFM. When overwriting the fail information that has been stored in the AFM with the new fail information, the test apparatus writes into the CMM the validity information that indicates that the new fail information is valid. Initialization of the AFM is performed in such a manner that, before and after the initialization, different validity information indicates validity of the fail information.

8 Claims, 7 Drawing Sheets

CLEAR INSTRUCTION INFORMATION TO INDICATE WHETHER MEMORY TEST FAILURE INFORMATION IS VALID

BACKGROUND

1. Technical Field

The present invention relates to a test apparatus and a test method. More particularly, the present invention relates to a test apparatus and a test method for testing a memory under test.

2. Related Art

A memory test apparatus is configured to generate an address signal and a data signal at a pattern generator and apply the generated address and data signals to a memory under test to perform data writing. The memory test apparatus also generates an expected value signal in association with the address signal at the pattern generator, and compares an output signal read from the memory under test with the expected value signal. When the output signal does not match the expected value signal, the memory test apparatus stores fail data representing the mismatch in an address fail memory (AFM) in a defect analysis memory in association with the address indicated by the address signal. The memory test apparatus performs a defect repair analysis on the memory under test by referring to the fail data stored in the AFM (see, for example, Japanese Patent Application Publication No. 10-055694).

Figure 7:
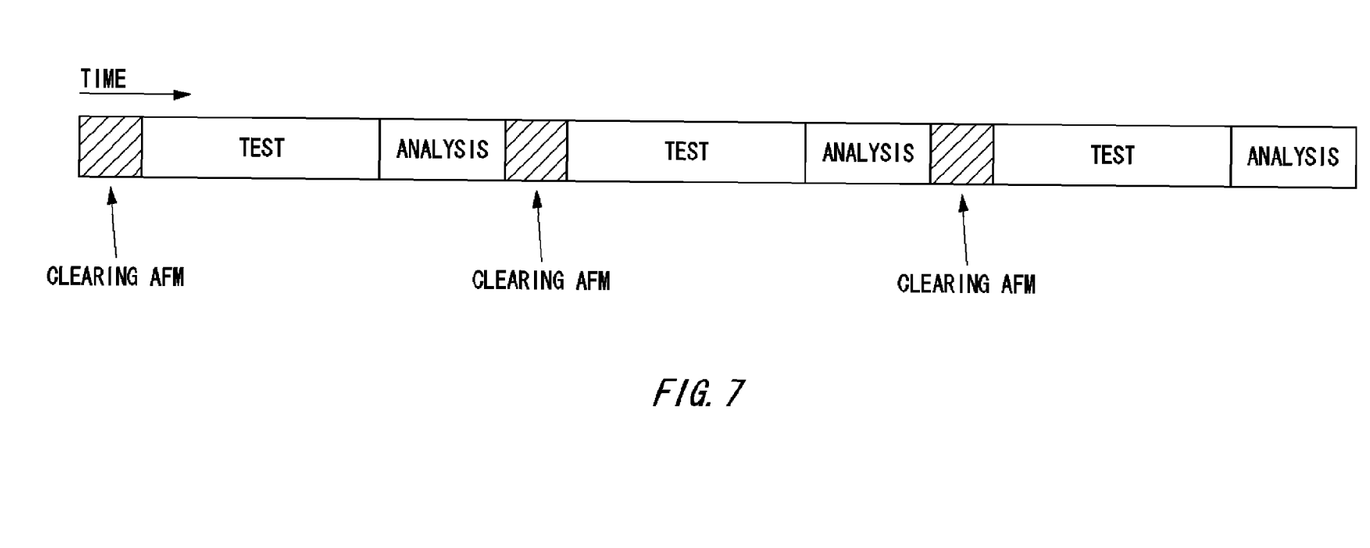
FIG. 7 illustrates a flow of operations performed in the conventional art to perform a defect repair analysis.

FIG. 7 illustrates the temporal relation between memory tests and defect repair analyses in the conventional art. To begin with, a conventional memory test apparatus clears an AFM by setting the logical values of all the pieces of data stored therein at zero (0). Subsequently, the memory test apparatus tests a memory under test and stores fail data by setting the logical value of corresponding data at one (1), if any defects are detected as the test proceeds. On completion of the test on the memory under test, the memory test apparatus performs a defect repair analysis on the memory under test by referring to the fail data stored in the AFM. After this, the memory test apparatus clears the AFM by setting the logical values of the pieces of data stored therein at 0 and then starts a test on a next memory under test.

Japanese Patent Application Publication No. 2005-259265 discloses a memory testing technique without the need of the above-mentioned AFM clearing step. A memory test apparatus employing this technique includes a clear mark memory (CMM) that retains, in association with each of the addresses of a memory under test, information indicating whether the associated address is to be tested for the first time. The memory test apparatus judges whether each address is to be tested for the first time by referring to the CMM. If a given address is to be tested for the first time, the memory test apparatus overwrites the old fail data in the AFM with the new fail data. If the given address is to be tested for the second or further time, the memory test apparatus stores the new fail data into the AFM in a read-modify-write manner. After completing the test on the memory under test, the memory test apparatus clears the CMM and then starts a next memory test.

Here, AFMs have a similar capacity as memories under test, and a recent exponential increase in the capacity of the memories under test thus results in a dramatic increase in the capacity of the AFMs. Such an increase inevitably increases the time required to clear the AFMs. Here, to remove the need to clear the AFMs, CMMs may be provided. However, the capacity of the CMMs is in proportion to the capacity of the AFMs, which also means a longer time required to clear the CMM. The memory test apparatus is required to discontinue the tests and wait for a long period of time to clear the AFMs or CMMs, thereby suffering from a lower testing throughput.

SUMMARY

Therefore, it is an object of an aspect of the innovations herein to provide a test apparatus and a test method which are capable of overcoming the above drawbacks accompanying the related art. The above and other objects can be achieved by combinations described in the independent claims. The dependent claims define further advantageous and exemplary combinations of the innovations herein.

According to an aspect related to the innovations herein, one exemplary test apparatus for testing a memory under test may include a writing section that writes data into at least one of addresses of the memory under test, a comparing section that compares, with an expected value signal, an output signal that is output from the memory under test in response to the data writing by the writing section, to output first fail information indicating whether the output signal matches the expected value signal, a fail memory that stores the first fail information in association with each of the addresses of the memory under test, a mark memory that stores, in association with each of the addresses of the memory under test, validity information indicating whether second fail information is valid, where the second fail information has been stored in the fail memory when the first fail information is stored, a fail information updating section that, in association with the address associated with the first fail information output from the comparing section, (i) when validity information read from the mark memory indicates second fail information is invalid, stores the first fail information into the fail memory, and (ii) when validity information read from the mark memory indicates second fail information is valid, calculates a logical OR between second fail information read from the fail memory and first fail information output from the comparing section and stores the logical OR into the fail memory, and a register that stores clear instruction information to be stored into the mark memory, where the clear instruction information indicating whether the second fail information is valid or invalid.

The summary clause does not necessarily describe all necessary features of the embodiments of the present invention. The present invention may also be a sub-combination of the features described above. The above and other features and advantages of the present invention will become more apparent from the following description of the embodiments taken in conjunction with the accompanying drawings.

DESCRIPTION OF EXEMPLARY EMBODIMENTS

Some aspects of the invention will now be described based on the embodiments, which do not intend to limit the scope of the present invention, but exemplify the invention. All of the features and the combinations thereof described in the embodiment are not necessarily essential to the invention.

Figure 1:
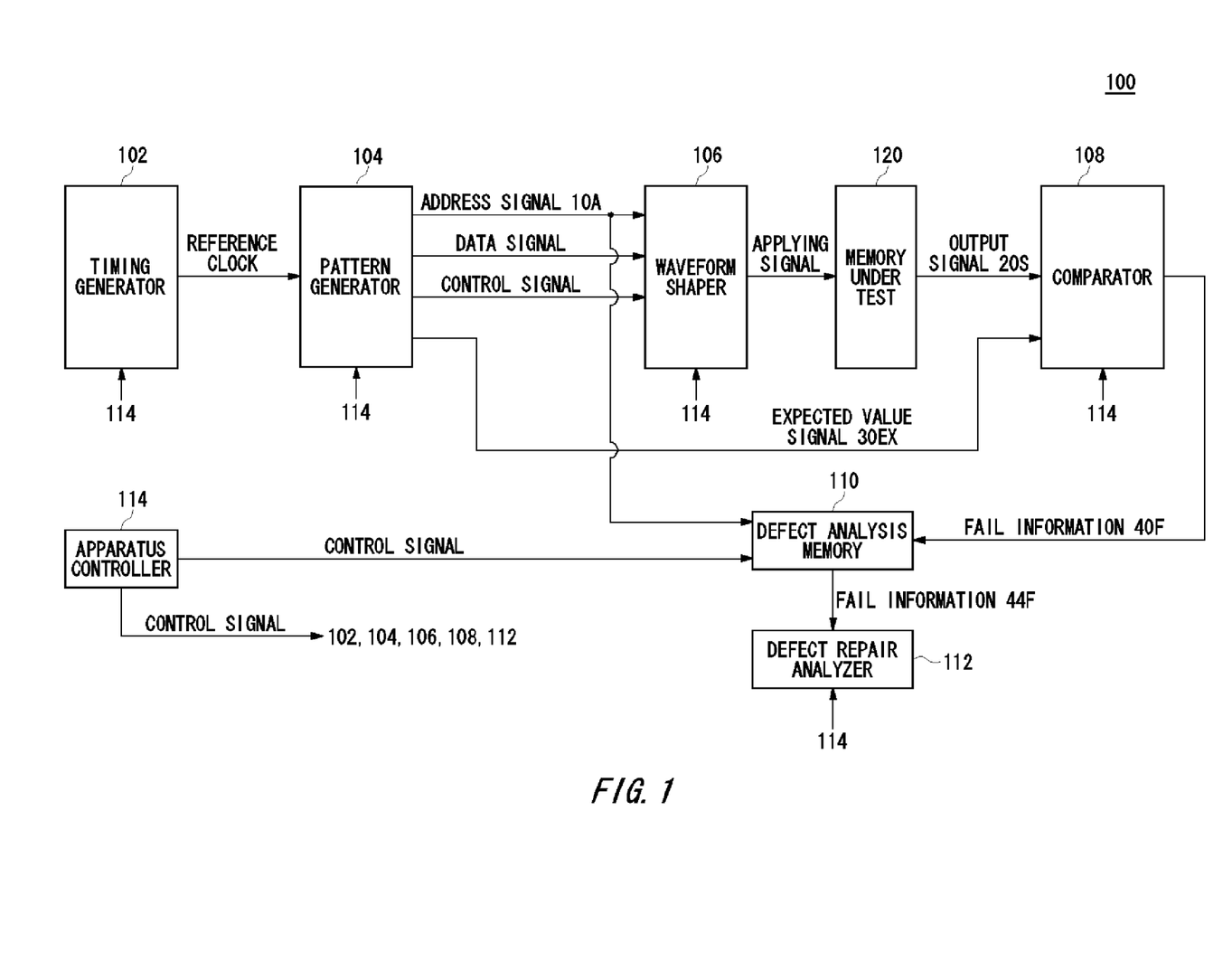
FIG. 1 illustrates an exemplary configuration of a test apparatus 100 relating to an embodiment of the present invention.

FIG. 1 illustrates an exemplary configuration of a test apparatus 100 relating to an embodiment of the present invention. The test apparatus 100 includes a timing generator 102, a pattern generator 104, a waveform shaper 106, a comparator 108, a defect analysis memory 110, a defect repair analyzer 112, and an apparatus controller 114.

The timing generator 102 generates a reference clock, and supplies the reference clock to the pattern generator 104. The pattern generator 104 executes a test pattern designed to test the memory under test 120, in accordance with the reference clock, generates an address signal 10A, a data signal, and a control signal to be supplied to the memory under test 120, and supplies the generated signals to the waveform shaper 106. The pattern generator 104 also generates an expected value signal 30EX that is expected to be output from the memory under test 120 in response to the address signal 10A, the data signal, and the control signal and supplies the expected value signal 30EX to the comparator 108. The waveform shaper 106 is shown as an example of a writing section relating to the present invention, and shapes the waveforms of the address signal 10A, the data signal, and the control signal into waveforms suitable to test the memory under test 120, and applies the resulting address signal 10A, data signal, and control signal to the memory under test 120. In this manner, the test apparatus 100 writes data into at least one address of the memory under test 120.

The comparator 108 compares an output signal 20S output from the memory under test 120 in response to the address signal 10A, the data signal, and the control signal with the expected value signal 30EX generated by the pattern generator 104. When the output signal 20S matches the expected value signal 30EX, the comparator 108 generates pass data. On the other hand, when the output signal 20S does not match the expected value signal 30EX, the comparator 108 generates fail data and supplies the fail data to the defect analysis memory 110. The pass data and the fail data are examples of first fail information relating to the present invention, and collectively referred to as fail information 40F. The defect analysis memory 110 stores the fail information 40F in the address designated by the address signal 10A. After the test apparatus 100 completes the test of the memory under test 120, the defect repair analyzer 112 reads fail information 44F from the defect analysis memory 110 to perform a defect repair analysis on the memory under test 120.

The apparatus controller 114 writes setting values into various registers or memory regions of the timing generator 102, the pattern generator 104, the waveform shaper 106, the comparator 108, the defect analysis memory 110, and the defect repair analyzer 112 for the purpose of setting various parameters of tests. Specifically speaking, the apparatus controller 114 is an arithmetic processing unit that is designed to execute preset test programs, and outputs control signals to write the setting values in accordance with the execution of the various instructions in the programs. The control signals include a register read command, a register write command, or writing data. In response to the register read command sent therefrom, the apparatus controller 114 receives read data. The apparatus controller 114 is shown as an example of a setting section relating to the present invention, and writes a value into a predetermined register in the defect analysis memory 110, for example, after the test apparatus 100 completes a particular series of tests. Such a configuration saves the test apparatus 100 from clearing the entire AFM in the defect analysis memory 110, since the test apparatus 100 can produce the same effects as if the defect analysis memory 110 were initialized very swiftly by writing a value into a register.

Figure 2:
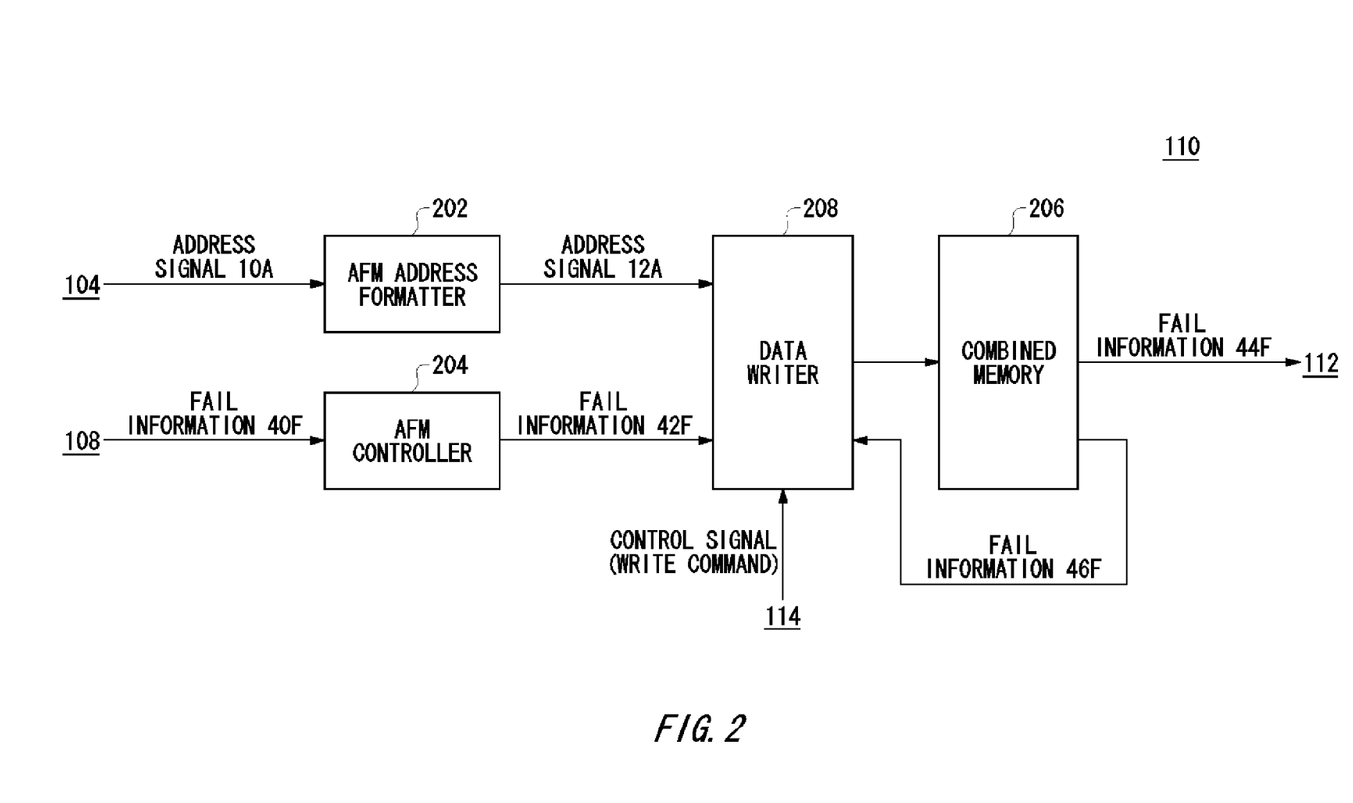
FIG. 2 illustrates an exemplary configuration of a defect analysis memory 110.

FIG. 2 illustrates an exemplary configuration of the defect analysis memory 110. The defect analysis memory 110 includes a combined memory 206 and a data writer 208. The combined memory 206 has functions as an AFM 300 and a CMM 310, as will be described in detail with reference to FIG. 3. The defect analysis memory 110 further includes an AFM address formatter 202 and an AFM controller 204 to control writing of data into the AFM 300. The AFM address formatter 202 formats the address signal 10A generated by the pattern generator 104 into an address signal 12A designating an address in the combined memory 206, and supplies the address signal 12A to the combined memory 206 via the data writer 208. The AFM controller 204 formats the fail information 40F generated by the comparator 108 into fail information 42F compatible with the AFM and outputs the fail information 42F. The AFM controller 204 generates a write signal as well as the fail information 42F, and applies the write signal to the combined memory 206 via the data writer 208. The data writer 208 stores the fail information 42F received from the AFM controller 204 into the address in the combined memory 206 that is designated by the address signal 12A received from the AFM address formatter 202. The fail information 42F stored in the combined memory 206, which is shown as an example of second fail information relating to the present invention, is read by the defect repair analyzer 112 and used for a defect repair analysis as fail information 44F.

The data writer 208 also has a role of controlling the accesses to the combined memory 206 in the following fashion. When the fail information that has already been stored in the combined memory 206 in the address designated by the address signal 12A received from the AFM address formatter 202 is invalid, the data writer 208 overwrites the fail information stored in the combined memory 206 with the fail information 42F received from the AFM controller 204. Stated differently, the invalid information such as results from preceding tests is appropriately erased by the overwriting. On the other hand, when the fail information that has already been stored in the combined memory 206 in the address designated by the address signal 12A received from the AFM address formatter 202 is valid, the data writer 208 updates the fail information 46F read from the combined memory 206 with the fail information 42F received from the AFM controller 204 and writes the updated fail information 46F back into the combined memory 206. With such a configuration, when testing the same address multiple times, for example, the test apparatus 100 can accumulate a plurality of pieces of fail data in the combined memory 206. The data writer 208 rewrites the value of a register 207 provided therein on reception of a control signal representing a write command from the apparatus controller 114. By rewriting the value of the register 207, the data writer 208 can produce the same effects as if the combined memory 206 were cleared.

Figure 3:
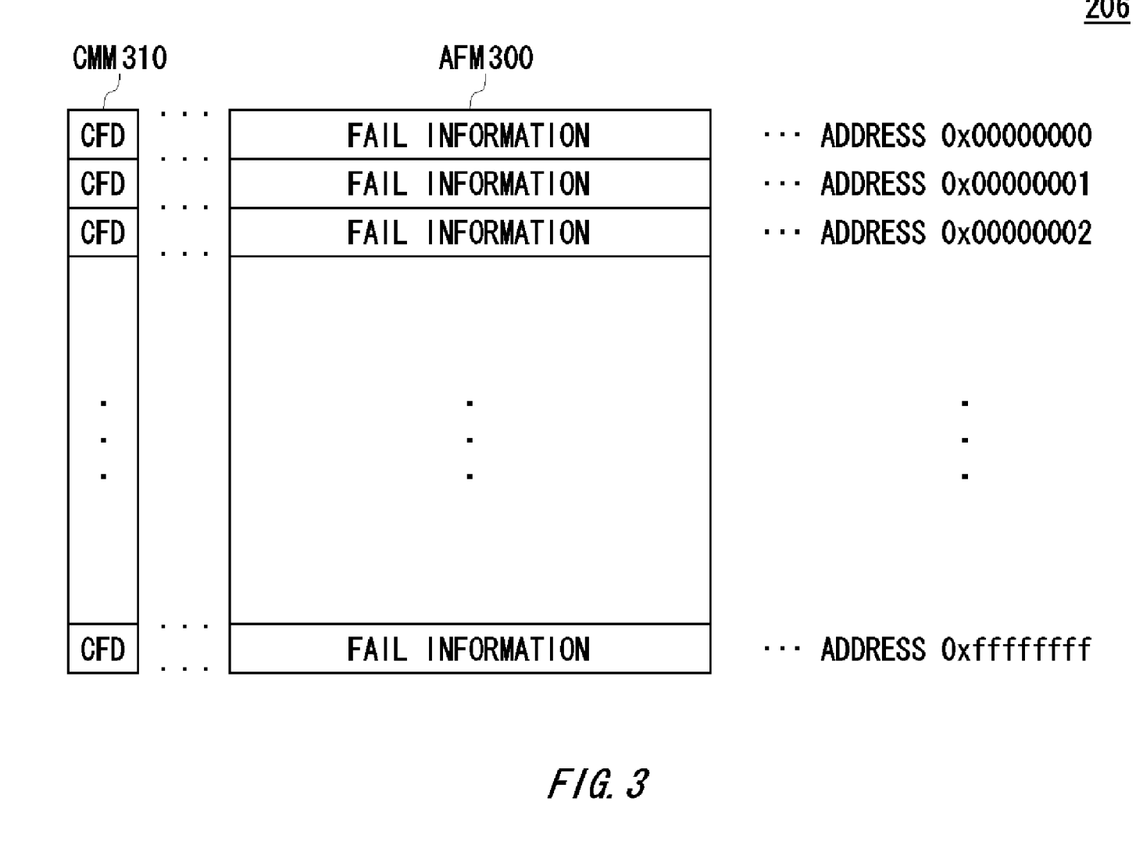
FIG. 3 illustrates an exemplary configuration of a combined memory 206.

FIG. 3 illustrates an exemplary configuration of the combined memory 206. The combined memory 206 has functions as the AFM 300 and the CMM 310. The AFM 300 is provided to store fail information in association with each of the addresses of the memory under test 120. For example, the fail information is data having a series of logical values respectively representing whether the data bits of the associated address are acceptable. For example, a logical value "0" is pass data indicating that a corresponding data bit is judged to be acceptable, and a logical value "1" is fail data indicating that a corresponding data bit is judged to be defective. When the test apparatus 100 tests the same address multiple times, the data writer 208 calculates a logical OR between the fail information that has been stored in the AFM 300 and the fail information 40F that is newly output from the comparator 108 and writes the logical OR back to the AFM 300. In this way, the AFM 300 can only accumulate fail data.

The CMM 310 stores, in association with each of the addresses of the combined memory 206, validity information indicating whether the fail information that has already been stored in the AFM 300 in association with the address is valid. Fail information associated with a given address of a given memory under test 120 is considered to be valid, for example, if the given address of the given memory under test 120 has already been tested one or more times and is thus currently tested for the second or further time and old fail information associated with the given address of the given memory under test 120 has already been overwritten at the first test. On the other hand, fail information associated with a given address of a given memory under test 120 is considered to be invalid, for example, if the given address of the given memory under test 120 has never been tested before and is currently tested for the first time and old fail information associated with the given address of the given memory under test 120 has not yet been overwritten. Thus, the validity information is a one-bit logical value which is set at 1 when the fail information is valid and at 0 when the fail information is invalid, for example. The validity information is hereinafter referred to as clear flag data (CFD). The CFD may be any type of information that can indicate whether fail information is valid, and may alternatively be information indicating the number of times at which fail information associated with a given address of a given memory under test 120 is updated, for example.

Figure 4:
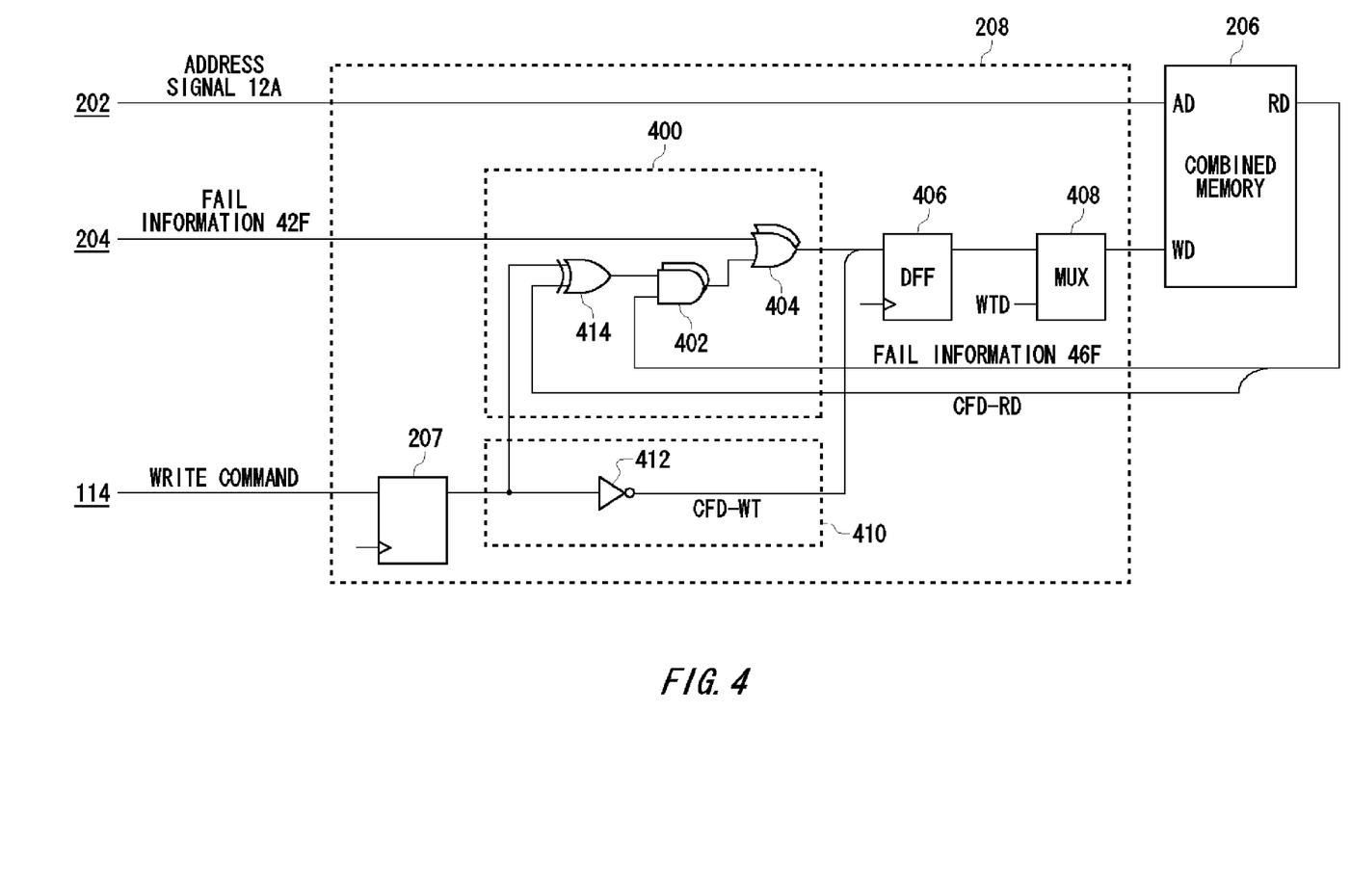
FIG. 4 illustrates an exemplary configuration of a data writer 208.

FIG. 4 shows an exemplary configuration of the data writer 208 to illustrate how to write data into the combined memory 206. The data writer 208 includes a register 207, a fail information updating section 400, a mark memory updating section 410, a D flip-flop (DFF) 406, and a multiplexer (MUX) 408. The register 207 stores clear instruction information that is to be stored in the CMM 310 in association with the fail information 42F stored in the AFM 300. The clear instruction information indicates whether the fail information 42F is valid or invalid, and is a one-bit logical value, for example. Here, the clear instruction information in the register 207 defines the relation between the logical value (0 or 1) of the CFD and the validity of the fail information stored in the AFM 300. For example, when the clear instruction information stored in the register 207 takes a logical value of 0, the CFD indicates that the fail information is invalid when taking a logical value of 0 and that the fail information is valid when taking a logical value of 1. On the other hand, when the clear instruction information stored in the register 207 takes a logical value of 1, the CFD indicates that the fail information is invalid when taking a logical value of 1 and that the fail information is valid when taking a logical value of 0. Stated differently, the logical value of the CFD is not the only factor that determines whether the fail information is valid or invalid, and is combined with the clear instruction information of the register 207 to determine whether the fail information is valid or invalid.

The fail information updating section 400 reads the fail information and the CFD that are stored in the combined memory 206 in association with the address associated with the fail information 40F output from the comparator 108. The read fail information is herein referred to as fail information 46F, and the read CFD is herein referred to as CFD-RD. The fail information updating section 400 then judges whether the fail information 46F is valid based on the CFD-RD and the clear instruction information of the register 207.

The fail information updating section 400 judges whether the CFD-RD read from the CMM 310 indicates that the fail information 46F is invalid. How this judgment is made will be described in detail later in relation to each state of the register 207. When the CFD-RD indicates that the fail information 46F is invalid, the fail information updating section 400 overwrites the fail information in the AFM 300 with the fail information 42F. On the other hand, when the CFD-RD read from the CMM 310 indicates that the fail information 46F is valid, the fail information updating section 400 updates the fail information 46F read from the AFM 300 with the fail information 42F that is received from the comparator 108 via the AFM controller 204 and writes the updated fail information 46F back into the AFM 300.

Depending on whether the logical value stored in the register 207 is zero or one, the same logical value of CFD-RD produces a different judgment as to whether read fail information is valid or invalid. Therefore, the following describes the operations of the circuits within the fail information updating section 400 for the case where the register 207 stores therein a logical value of 0 and for the case where the register 207 stores therein a logical value of 1, respectively. Specifically speaking, the fail information updating section 400 includes a logical AND circuit 402, a logical OR circuit 404, an logical XOR circuit 414.

(1) When the Register 207 Stores a Logical Value of 0

In this case, if the CFD takes a logical value of 0, the fail information stored in the AFM 300 in association with the CFD is judged to be invalid. For example, the logical XOR circuit 414 calculates a logical XOR between the CFD-RD that is read from the address in the CMM 310 that is designated by the address signal 12A and the logical value "0" read from the register 207. For example, the logical XOR circuit 414 outputs a logical value of 1 when the CFD-RD takes a logical value of 1 and outputs a logical value of 0 when the CFD-RD takes a logical value of 0.

The logical AND circuit 402 calculates and outputs a logical AND between the logical value output from the logical XOR circuit 414 and each of the bits of the fail information 46F read from the combined memory 206. For example, when the CFD-RD takes a logical value of 1 and the logical XOR circuit 414 thus outputs a logical value of 1, the logical AND circuit 402 outputs the fail information 46F. On the other hand, when the CFD-RD takes a logical value of 0 and the logical XOR circuit 414 thus outputs a logical value of 0, the logical AND circuit 402 outputs a bit string whose bits each take a logical value of 0.

The logical OR circuit 404 calculates a logical OR between the fail information 42F and each of the bits of the bit string output from the logical AND circuit 402, and outputs the result to the DFF 406. For example, when the CFD-RD takes a logical value of 1, the logical OR circuit 404 outputs the bit-wise logical OR between the fail information 42F and the fail information 46F to the DFF 406. On the other hand, when the CFD-RD takes a logical value of 0, the logical OR circuit 404 outputs only the fail information 42F to the DFF 406. With such a configuration, when the CFD-RD takes a logical value of 0, the fail information updating section 400 outputs only the fail information 42F to initialize the fail information 46F that has been stored in the combined memory 206. On the other hand, when the CFD-RD takes a logical value of 1, the fail information updating section 400 outputs the logical OR between the fail information 42F and the fail information 46F to update the fail information 46F that has been stored in the combined memory 206 with the fail information 42F.

(2) When the Register 207 Stores a Logical Value of 1

In this case, if the CFD takes a logical value of 1, the fail information stored in the AFM 300 in association with the CFD is judged to be invalid. Specifically speaking, the logical XOR circuit 414 calculates a logical XOR between the validity information (CFD-RD) that is read from the address in the CMM 310 that is designated by the address signal 12A and the logical value "0" read from the register 207. For example, the logical XOR circuit 414 outputs a logical value of 0 when the CFD-RD takes a logical value of 1 and outputs a logical value of 1 when the CFD-RD takes a logical value of 0.

The logical AND circuit 402 calculates and outputs a logical AND between the logical value output from the logical XOR circuit 414 and each of the bits of the fail information 46F read from the combined memory 206. For example, when the CFD-RD takes a logical value of 0 and the logical XOR circuit 414 thus outputs a logical value of 1, the logical AND circuit 402 outputs the fail information 46F without a change. On the other hand, when the CFD-RD takes a logical value of 1 and the logical XOR circuit 414 thus outputs a logical value of 0, the logical AND circuit 402 outputs a bit string whose bits each take a logical value of 0.

The logical OR circuit 404 calculates a logical OR between the fail information 42F and each of the bits of the bit string output from the logical AND circuit 402, and outputs the result to the DFF 406. For example, when the CFD-RD takes a logical value of 1, the logical OR circuit 404 outputs the bit-wise logical OR between the fail information 42F and the fail information 46F to the DFF 406. On the other hand, when the CFD-RD takes a logical value of 0, the logical OR circuit 404 outputs only the fail information 42F to the DFF 406. With such a configuration, when the CFD-RD takes a logical value of 1, the fail information updating section 400 outputs only the fail information 42F to initialize the fail information 46F stored in the combined memory 206. On the other hand, when the CFD-RD takes a logical value of 0, the fail information updating section 400 outputs the logical OR between the fail information 42F and the fail information 46F to update the fail information 46F in the combined memory 206 with the fail information 42F.

The following describes the mark memory updating section 410. When the fail information updating section 400 writes any fail information into the AFM 300, the mark memory updating section 410 writes, into the CMM 310, CFD having a logical value that indicates that the fail information is valid, irrespective of whether the fail information updating section 400 overwrites the stored fail information or updates the stored fail information and writes the updated fail information. Specifically speaking, the mark memory updating section 410 includes an inverter 412. The inverter 412 inverts the logical value output from the register 207 to generate CFD (CFD-WT) that is to be written into the CMM 310 and that indicates that the given fail information is valid, and supplies the generated CFD to the DFF 406. Alternatively, when the fail information updating section 400 overwrites the fail information stored in the AFM 300 with given fail information, the mark memory updating section 410 writes, into a corresponding address in the CMM 310, CFD having a logical value that indicates that the given fail information is valid, but when the fail information updating section 400 updates the stored fail information and writes the updated fail information into the AFM 300, the mark memory updating section 410 may not write, into a corresponding address in the CMM 310, CFD having a logical value indicating that the updated file information is valid.

The DFF 406 latches the data output from the logical OR circuit 404 and the inverter 412 while the combined memory 206 transits from the read mode to the write mode and supplies the latched data to the combined memory 206. The MUX 408 supplies different data to be written into the combined memory 206, between when fail information is to be stored into the combined memory 206 and when other operations are performed. Specifically speaking, when fail data is to be stored into the combined memory 206, the MUX 408 selects the data supplied from the DFF 406 and supplies the selected data to the combined memory 206. When the combined memory 206 is checked as to whether it correctly operates or not, the MUX 408 selects WTD output from the apparatus controller 114 and supplies the selected data to the combined memory 206. In response to this, the combined memory 206 stores the data supplied from the MUX 408 onto the address designated by the address signal 12A supplied from the AFM address formatter 202.

The logical value stored in the register 207 is changed when the test apparatus 100 starts a new test after completing a given test, for example, when the test apparatus 100 has completed a given test and has the results of the test stored in the AFM 300, but discards the stored test results and starts a next test. Furthermore, the logical value stored in the register 207 may be changed when the test apparatus 100 is powered on and starts a test, or when the test apparatus 100 restarts a test for some reasons.

Specifically speaking, the register 207 changes the logical value stored therein, in response to the write command that is received from the apparatus controller 114. For example, the register 207 may invert the logical value stored therein. As a result of the change of the logical value, the operation of the fail information updating section 400 changes from the operation described in relation to the case (1) to the operation described in relation to the case (2), or vice versa. Accordingly, in spite of the fact that the CFD-RD has the same logical value before and after completion of a given test, the fail information updating section 400 judges the fail information to be valid before the completion of the given test but to be invalid after the completion of the given test. Therefore, after completion of a particular test, the fail information updating section 400 determines that the fail information that is stored in the AFM 300 during the particular test is invalid. With such a configuration, the test apparatus 100 can produce the same effects as if the AFM 300 were cleared without actually changing the content of the AFM 300.

The method to update the register 207 is not limited to inverting the logical value stored in the register 207. For example, a case is assumed where the clear instruction information stored in the register 207 is not a one-bit logical value. In this case, after completion of a test, the apparatus controller 114 may store into the register 207 information that is different from the clear instruction information that is stored in the register 207 before the completion of the test. Thus, the apparatus controller 114 may update the register 207 in any fashion, provided that the same validity information indicates that the fail information stored in the AFM 300 is valid before the register 207 is updated but indicates that the fail information stored in the AFM 300 is invalid after the register 207 is updated.

The above-described circuit configuration is provided by way of example only, and the person skilled in the art would appreciate that various modifications can be implemented as follows. As a modification example, the clear instruction information stored in the register 207 may be different from the above example. Specifically speaking, the clear instruction information stored in the register 207 may be the validity information that is stored in the CMM 310 when the fail information stored in the AFM 300 is valid. In this modification example, the logical XOR circuit 414 outputs negation of the logical XOR between the logical values input thereto. Specifically speaking, the fail information updating section 400 judges whether the fail information 46F read from the AFM 300 is valid based on the result of the comparison between the CFD-RD read from the CMM 310 and the clear instruction information which indicates that the fail information is valid. Thus, the clear instruction information stored in the register 207 may be at least one of the information that is stored in the CMM 310 when the fail information is invalid and the information that is stored in the CMM 310 when the fail information is valid.

Figure 5:
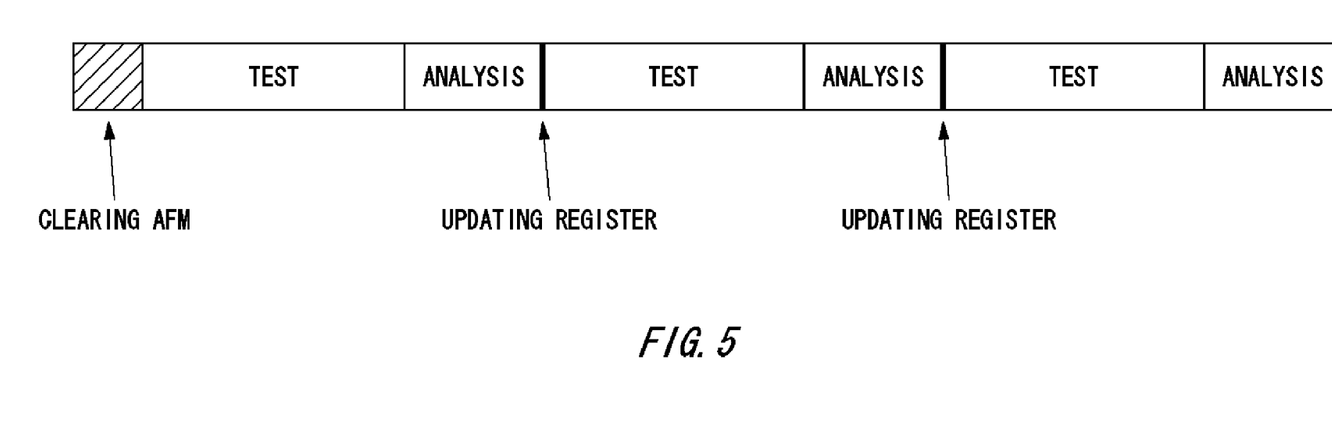
FIG. 5 illustrates a flow of operations performed by the test apparatus 100 relating to the embodiment of the present invention to perform a defect analysis.

FIG. 5 illustrates the temporal relation between memory tests and defect repair analyses performed by the test apparatus 100 relating to the present embodiment. To begin with, the test apparatus 100 clears the AFM 300 by setting the logical values of the stored data pieces at 0, then tests the memory under test 120, and stores fail data represented by a logical value of 1 in a read-modify-write manner. On completion of the test on the memory under test 120, the test apparatus 100 performs a defect repair analysis on the memory under test 120 by referring to the fail data stored in the AFM 300. On completion of the defect repair analysis, the test apparatus 100 inverts the logical value stored in the register 207, and then starts a next test on a different memory under test 120. Thus, the test apparatus 100 relating to the present embodiment can significantly shorten the time between tests, thereby improving the throughput of the overall test process.

At the time of the startup of the test apparatus 100 as shown in FIG. 5, the apparatus controller 114 not only inverts the logical value of the register 207 but also clears the fail information retained in the AFM 300. In addition, the apparatus controller 114 may clear both the fail information retained in the AFM 300 and the CFD retained in the CMM 310 when the test apparatus 100 performs a test on a memory under test of a different type from the previous test or when the test apparatus 100 performs a test in accordance with a different sequence of addresses. In this manner, before starting a new test, the test apparatus 100 can correctly erase the results of the previous test.

The following describes a modification example of the above-described embodiment. According to this modification example, the defect analysis memory 110 includes a plurality of combined memories 206 to store the fail information 40F in an interleaving manner among the combined memories 206. This modification example is employed when a low-speed memory element is used to implement the combined memory 206 and the memory under test 120 is tested at a high speed. In this modification example, the defect analysis memory 110 includes a plurality of combined memories (206-1 to 206-N), so that the combined memories 206-1 to 206-N sequentially operate in accordance with the interleaving technique. This modification example can produce the same effects as if the single combined memory 206 is implemented by a high-speed memory element.

When the interleaving technique is used, fail information 40F that is output in response to a given pattern in a test pattern executed to perform a test on the memory under test 120 is stored into one of the combined memories 206-1 to 206-N that is selected depending on what number pattern is the given pattern. Here, when implemented by DRAM, the memory under test 120 needs to be refreshed while being tested out of synchronization with the test. Assuming that the fail information 40F is output in response to an n-th pattern in a test pattern, the value of n differs among tests because of the refresh operation. Therefore, if the combined memory 206 into which the fail information 40F is stored is switched among the combined memories 206-1 to 206-N simply in accordance with the reference clock, corresponding pieces of fail information obtained from the same type of tests may be stored in different ones of the combined memories 206-1 to 206-N.

This problem is solved by a modification example described in the following with reference to FIG. 6. According to this modification example, the fail information 40F is written into the combined memories 206-1 to 206-N only in response to comparison cycles during a test, excluding out-of-synchronization accesses such as the refresh operation during the test. The following specifically describes this modification example.

Figure 6:
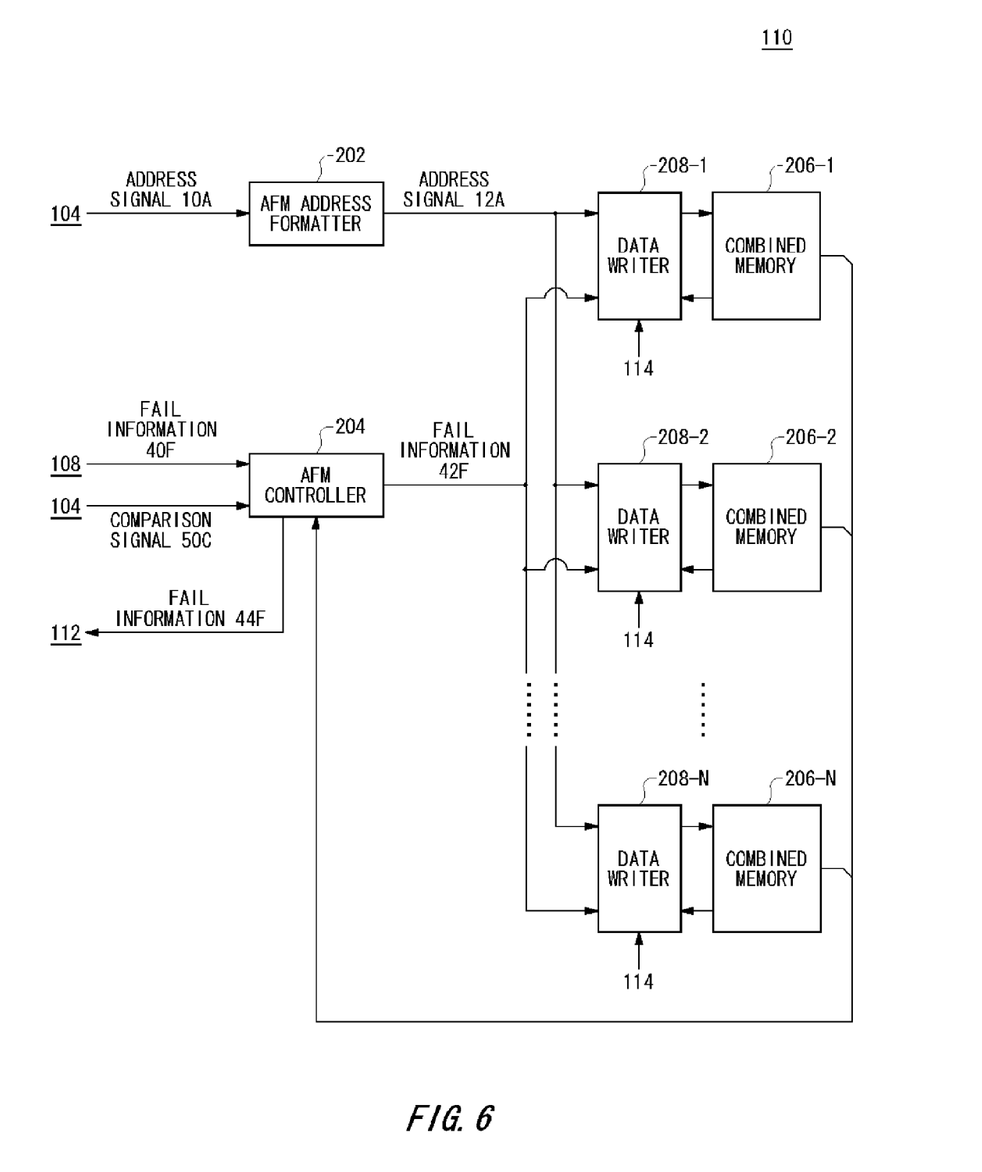
FIG. 6 illustrates a modification example of the defect analysis memory 110 relating to the embodiment of the present invention.

FIG. 6 illustrates the defect analysis memory 110 relating to the above-mentioned modification example of the present embodiment. According to the present modification example, the defect analysis memory 110 includes the AFM address formatter 202 and the AFM controller 204, similarly to the exemplary embodiment shown in FIG. 2. Differently from the exemplary embodiment shown in FIG. 2, however, the defect analysis memory 110 relating to the present modification example includes a plurality of combined memories 206 (for example, combined memories 206-1 to 206-N) for the purpose of storing the fail information 40F at a higher speed. Accordingly, the defect analysis memory 110 relating to the present modification example includes a plurality of data writers 208 (for example, the data writers 208-1 to 208-N).

Each of the combined memories 206-1 to 206-N has substantially the same configuration as the combined memory 206 shown in FIG. 3. For example, each of the combined memories 206-1 to 206-N similarly has the AFM 300 and the corresponding CMM 310. Thus, the defect analysis memory 110 is N-way interleaved. The fail information is stored in an interleaving manner among the AFMs 300. The CFD is also stored in an interleaving manner among the CMMs 310, in such a manner that the CFD stored in each CMM 310 determines whether the fail information stored in the corresponding AFM 300 is valid. In the following, the term "a combined memory 206" may be used instead of a phrase "an AFM 300 and a corresponding CMM 310" for the sake of simplicity but both expressions are used interchangeably. The following description is made assuming that each of the combined memories 206-1 to 206-N is initialized, for example, by setting the logical value of every bit at 0 when the test apparatus 100 starts up or when a memory under test 120 of a certain type is replaced by a memory under test 120 of a different type.

In this modification example, the AFM address formatter 202 and the AFM controller 204 basically have the same functions as in the exemplary embodiment shown in FIG. 2. Specifically speaking, the AFM address formatter 202 formats the address signal 10A generated by the pattern generator 104 into the address signal 12A and supplies the resulting address signal 12A to each of the combined memories 206-1 to 206-N via a corresponding one of the data writers 208-1 to 208-N. The AFM controller 204 formats the fail information 40F into the fail information 42F in accordance with the AFM, and applies the fail information 42F to one of the combined memories 206-1 to 206-N via a corresponding one of the data writers 208-1 to 208-N.

The AFM controller 204 relating to the present modification example functions as an example of a selecting section relating to the present invention, and is configured to control the combined memories 206-1 to 206-N in accordance with the interleaving technique as follows. According to the present modification example, the pattern generator 104 outputs a comparison signal 50C to the defect analysis memory 110 in a comparison cycle in which the output signal 20S is compared with the expected value signal 30EX (in other words, in the cycle in which the data read from the memory under test 120 is checked as to whether it satisfies the expected value). Here, the pattern generator 104 does not output the comparison signal 50C in other cycles than the comparison cycle, including an idle cycle and a refresh cycle that is required when the memory under test 120 is implemented by DRAM. The comparison signal 50C may be supplied from the pattern generator 104 to the comparator 108 in a conventional test apparatus 100 in order to cause the comparator 108 to operate in accordance with the comparison cycle. Stated differently, the test apparatus 100 relating to the present modification example is configured to supply the comparison signal 50C not only to the comparator 108 but also to the defect analysis memory 110.

In response to the reception of the comparison 50C from the pattern generator 104, the AFM controller 204 outputs, to the first combined memory 206 (for example, the combined memory 206-1), the fail information 42F obtained by formatting the fail information 40F in accordance with the AFM 300. After this, in response to the reception of the next comparison signal, the AFM controller 204 selects a combined memory 206 to which the next fail information 42F is to be written (for example, the combined memory 206-2). The AFM controller 204 then outputs the next fail information 42F to the selected combined memory 206-2. The AFM controller 204 repeatedly performs the above-described series of steps every time the AFM controller 204 receives the comparison signal. In this manner, the AFM controller 204 sequentially selects the combined memories 206-1 to 206-N in a predetermined order, for example, in an ascending order as a combined memory into which a pair of fail information 42F and CFD is written, so that each piece of fail information 42F is written into the selected one of the combined memories 206-1 to 206-N.

For example, after the test apparatus 100 completes a test on the memory under test 120, the AFM controller 204 reads the fail information from the combined memories 206-1 to 206-N to perform a defect analysis. At this point, however, the AFM controller 204 does not know which one of the combined memories 206-1 to 206-N stores the fail information associated with a particular address of the memory under test 120. Therefore, the AFM controller 204 reads the fail information stored in the address associated with the particular address of the memory under test 120 from all of the combined memories 206-1 to 206-N and calculates a logical OR between the read pieces of fail information in association with the particular address of the memory under test 120. When the logical value "1" means fail, for example, the above-mentioned logical OR operation can correctly retrieve the fail information associated with the particular address of the memory under test 120. The AFM controller 204 outputs the fail information obtained by the logical OR operation performed for each of the addresses of the memory under test 120, to the defect repair analyzer 112 as the fail information 44F.

For example, after the test apparatus 100 completes execution of a test and completes output of the corresponding fail information, the apparatus controller 114 inverts the logical value of the register 207 provided in each data writer 208 in order that the test apparatus 100 subsequently performs a test on a memory under test 120 of the same type. The AFM controller 204 also initializes the selection of the combined memory 206 into which the next fail information 42F is written, so that the first combined memory 206-1 is selected. The AFM controller 204 then sequentially selects the combined memories 206-1 to 206-N in the same predetermined order as in the previous test, in order that the fail information and the like are written into the selected combined memory 206. Thus, in a particular comparison cycle in the test pattern executed to perform the current test, the AFM controller 204 selects the same combined memory 206 as in its corresponding comparison cycle in the test pattern executed to perform the previous test. Accordingly, the test apparatus 100 can write a pair of fail information and CFD associated with a certain address of the memory under test 120 into the same combined memory 206 irrespective of whether how many times the same test pattern is repeated in the present modification example.

As described above, the test apparatus 100 relating to the present modification example writes the fail information 40F into the combined memories 206-1 to 206-N only in response to the comparison cycle, when configured to store the fail information 40F in an interleaving manner among the combined memories 206-1 to 206-N. With such a configuration, when executing the same test pattern a plurality of times to test a plurality of memories under test 120 of the same type, the test apparatus 100 can select the same combined memory 206 from among the combined memories 206-1 to 206-N in every test to store the fail information associated with a particular address, despite out-of-synchronization operations such as refresh operation. Therefore, inverting the logical value stored in the register 207 in each AFM 300 can also produce the same effects as if each AFM 300 were cleared in the present modification example.

The test apparatus 100 relating to the above modification example has the following secondary advantage in addition to the advantage of appropriately control the memory interleaving. In recent years, more defect analysis memories 110 are designed not to operate or perform the storing operation in the case where the defect analysis memories 110 receive pass data, that is to say, in the case where none of the pieces of fail information received from the comparator 108 indicates failure or the logical value of 1. When the defect analysis memory 110 is configured in this way, a different number of pieces of fail information are stored in the defect analysis memory 110 in association with each memory under test since failures occur differently in each memory under test. According to the present modification example, however, the AFM controller 204 accesses the combined memory 206 selected in accordance with the comparison signal irrespective of whether failures occur or not. In this way, the fail information associated with a particular address of each memory under test is stored in the same combined memory 206 irrespective of how failures occur in the memory under test.

Although some aspects of the present invention have been described by way of exemplary embodiments, it should be understood that those skilled in the art might make many changes and substitutions without departing from the spirit and the scope of the present invention which is defined only by the appended claims.

What is claimed is:

1. A test apparatus for testing a memory under test, comprising:
a writing section that writes data into at least one of addresses of the memory under test;

a comparing section that compares, with an expected value signal, an output signal that is output from the memory under test in response to the data writing by the writing section, to output first fail information indicating whether the output signal matches the expected value signal;

a fail memory that is to store the first fail information in association with each of the addresses of the memory under test;

a mark memory that stores, in association with each of the addresses of the memory under test, validity information indicating whether second fail information is valid, the second fail information being fail information that is stored in the fail memory;

a fail information updating section that, in association with an address associated with the first fail information output from the comparing section, (i) when validity information read from the mark memory indicates second fail information is invalid, stores the first fail information into the fail memory, and (ii) when validity information read from the mark memory indicates second fail information is valid, calculates a logical OR between second fail information read from the fail memory and first fail information output from the comparing section and stores the logical OR into the fail memory; and a register that stores clear instruction information to be stored into the mark memory, the clear instruction information indicating whether the second fail information is valid or invalid.

2. The test apparatus as set forth in claim 1, further comprising:

a mark memory updating section that, when the fail information updating section stores second fail information, stores validity information indicating that the second fail information is valid into a corresponding address in the mark memory; and a setting section that, after a current test ends and before a next test starts, changes the clear instruction information in such a manner that the changed clear instruction information indicates that the second fail information is invalid.

3. The test apparatus as set forth in claim 2, wherein the fail information updating section compares validity information read from the mark memory with the clear instruction information stored in the register to judge whether the validity information indicates that second fail information is valid, and after a test ends and when a next test starts, the setting section writes, into the register, information that is different from the clear instruction information that has been stored in the register.

4. The test apparatus as set forth in claim 3, wherein the register stores, as the clear instruction information, a one-bit logical value to be stored in the mark memory, to indicate whether the second fail information stored in the fail memory is valid or invalid, the mark memory updating section compares a logical value read from the mark memory with a logical value stored in the register to judge whether the logical value indicates that second fail information is valid, and the setting section inverts the logical value stored in the register after a test ends and when a next test starts.

5. The test apparatus as set forth in claim 2, comprising a combined memory that has an address space corresponding to an address space of the memory under test, the combined memory functioning as the mark memory and the fail memory by storing, in each of addresses thereof, the second fail information for a corresponding address of the memory under test and the validity information indicating whether the second fail information is valid, wherein the fail information updating section reads from the combined memory the second fail information and the validity information in association with the address associated with the first fail information output from the comparing section, and judges whether the second fail information is valid based on the read validity information, and when the fail information updating section stores the first fail information into the fail memory, the mark memory updating section stores second fail information that is the stored first fail information and validity information indicating that the second fail information is valid, into an address in the combined memory that corresponds to the address associated with the first fail information output from the comparing section.

6. The test apparatus as set forth in claim 2, wherein when the test apparatus performs a test on a different address space than a previous test, the setting section clears second fail information retained in the fail memory or writes into the mark memory validity information indicating that second fail information is invalid.

7. The test apparatus as set forth in claim 2, further comprising:

a plurality of the fail memories;

a plurality of the mark memories that respectively correspond to the plurality of fail memories, each mark memory storing validity information indicating whether the second fail information stored in a corresponding fail memory is valid;

a pattern generator that executes a test pattern to test the memory under test and generates a comparison signal in a comparison cycle in which an output signal output from the memory under test is compared with an expected value signal; and a selecting section that, in response to the comparison signal, sequentially selects each of the plurality of fail memories and a corresponding one of the plurality mark memories so that the fail information updating section and the mark memory updating section store the first fail information and validity information into the selected fail memory and the selected mark memory, wherein when the pattern generator executes the same test pattern a plurality of times, the selecting section selects the same fail memory and the same mark memory in a particular comparison cycle each time the test pattern is executed.

8. A test method for testing a memory under test, comprising:

writing data into at least one of addresses of the memory under test;

comparing, with an expected value signal, an output signal that is output from the memory under test in response to the data writing, to output first fail information indicating whether the output signal matches the expected value signal;

storing the first fail information into a fail memory in association with each of the addresses of the memory under test;

storing into a mark memory, in association with each of the addresses of the memory under test, validity information indicating whether second fail information is valid, the second fail information being fail information that is stored in the fail memory;

in association with an address associated with the output first fail information, (i) when validity information read from the mark memory indicates second fail information is invalid, storing the first fail information into the fail memory, and (ii) when validity information read from the mark memory indicates second fail information is valid, calculating a logical OR between second fail information read from the fail memory and first fail information output in the comparing and storing the logical OR into the fail memory;

storing into a register clear instruction information to be stored into the mark memory, the clear instruction information indicating whether the second fail information is valid or invalid; and after a current test ends and before a next test starts, changing the clear instruction information in such a manner that the changed clear instruction information indicates that the second fail information is invalid.

* * * * *